Figure 1:
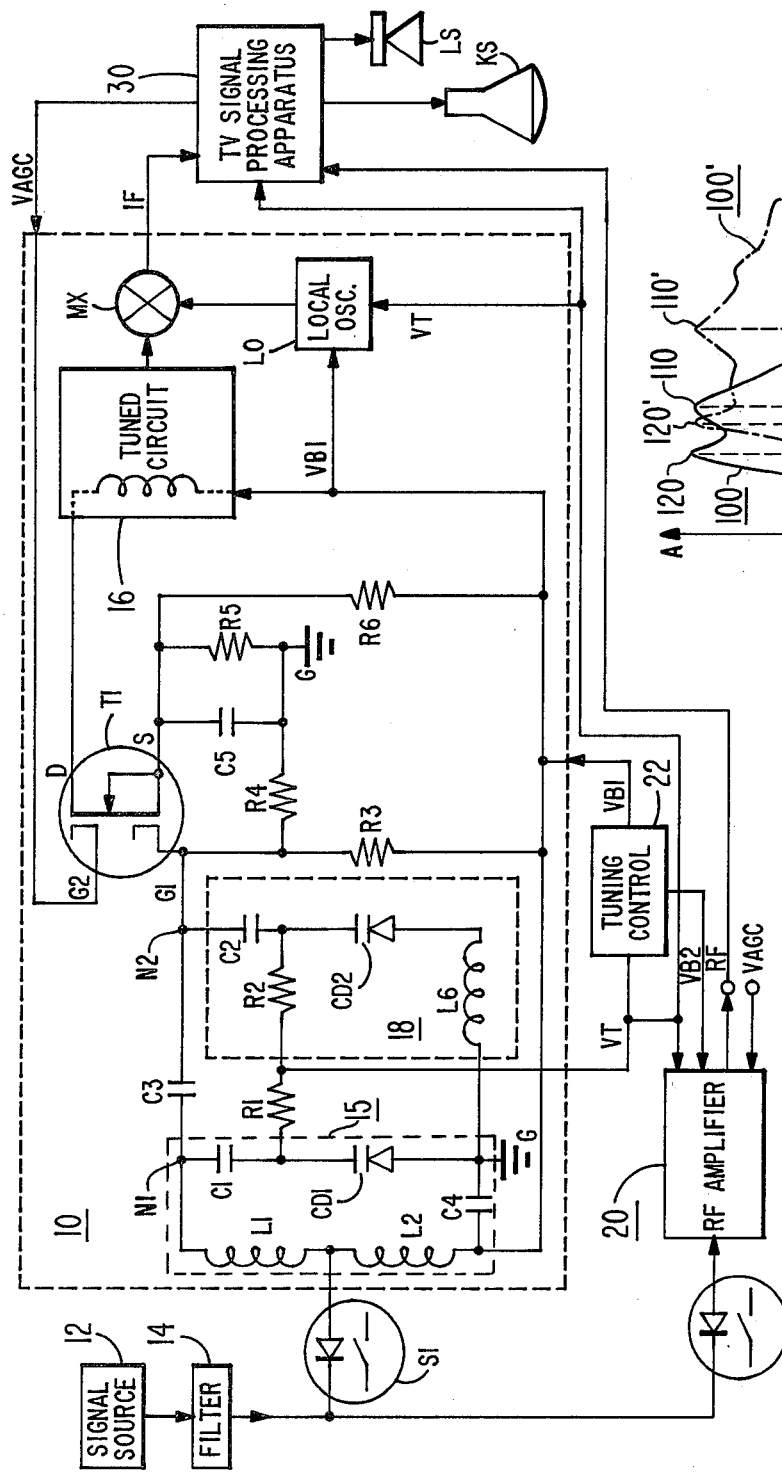

United States Patent [19]

Lehmann

[11] 4,442,548
[45] Apr. 10, 1984

[54] TELEVISION RECEIVER TUNING CIRCUIT TUNABLE OVER A WIDE FREQUENCY RANGE

[75] Inventor: William L. Lehmann, Indianapolis, Ind.

[73] Assignee: RCA Corporation, New York, N.Y.

[21] Appl. No.: 378,115

[22] Filed: May 14, 1982

[51] Int. Cl.³ .................. H04B 1/16; H03F 3/191
[52] U.S. Cl. ...................... 455/195; 455/179; 455/197; 334/15; 330/305
[58] Field of Search .......... 455/179, 180, 195, 197, 455/191, 187, 340, 285, 286, 291, 293; 358/191.1; 334/15; 330/302, 305

[56] References Cited

U.S. PATENT DOCUMENTS

| | | | |
|---|---|---|---|
| 3,555,431 | 1/1971 | Wilcox | 455/187 |
| 3,593,154 | 7/1971 | Blass | 455/179 |
| 3,611,154 | 10/1971 | Kupfer | 455/197 |
| 3,622,891 | 11/1971 | Leland | 325/381 |
| 3,696,302 | 10/1972 | Gossard | 325/432 |
| 4,023,106 | 5/1977 | Utsunomiya | 455/179 |
| 4,048,598 | 9/1977 | Knight | 334/15 |
| 4,214,217 | 7/1980 | Saito et al. | 334/45 |
| 4,215,372 | 7/1980 | Suzuki | 358/188 |
| 4,291,290 | 9/1981 | Ijichi et al. | 334/1 |
| 4,361,909 | 11/1982 | Theriault | 455/286 |
| 4,368,541 | 1/1983 | Evans | 455/186 |

OTHER PUBLICATIONS

RCA Television Service Data Supplement, Chassis CTC 110 Series, File 1981-C-1-S5, pp. 1, 5-7.
RCA Television Product Technical Manual, May 1981, pp. 25-27.

Primary Examiner—Jin F. Ng
Attorney, Agent, or Firm—Paul J. Rasmussen; Clement A. Berard, Jr.; Peter M. Emanuel

[57] ABSTRACT

A radio frequency (RF) amplifier including a resonant circuit having a peaked response is tunable in response to a tuning voltage to select RF carriers over a wide range of frequencies and includes an additional resonant circuit for improving its response at the low frequency end of that range. The additional resonant circuit has a peaked response tunable in response to the tuning voltage in tracking relationship to that of the first resonant circuit. The tracking relationship is desirably selected so that the additional resonant circuit does not become tuned to a frequency which is an integral sub-multiple of the frequency of a selected RF carrier.

11 Claims, 2 Drawing Figures

TELEVISION RECEIVER TUNING CIRCUIT TUNABLE OVER A WIDE FREQUENCY RANGE

The present invention relates to tuning systems suitable for television receivers and particularly to tuning systems receiving radio frequency (RF) carriers over a wide range of frequencies.

A television (TV) receiver receives RF carriers in very wide frequency ranges and it is difficult to construct tuning circuits which operate satisfactorily over such ranges. This problem is particularly acute near the minimum and maximum frequencies of a range, especially where the range is extremely wide.

A solution to this problem in relation to UHF-TV band tuners is described in U.S. Pat. No. 4,048,598 entitled UHF TUNING CIRCUIT UTILIZING A VARACTOR DIODE issued to S. P. Knight on Sept. 13, 1977 and includes an impedance transformation network comprises a series connected capacitor and shunt connected inductor coupled to an RF amplifier for improving its response at the low frequency end of the UHF-TV band. That UHF tuner has a resonant network providing a peaked response tunable over the UHF-TV band for selecting RF carriers and the impedance transformation network providing a peaked response at a frequency slightly below the UHF-TV band.

The UHF TV band encompasses frequencies between 470 megahertz (MHz) and 890 MHz, i.e. a range of less than two to one, whereas the frequency range of received RF carriers provided by a cable television (CATV) system is much greater than two to one and can approach eight to one. CATV RF carriers commonly range from a low frequency of 55.25 MHz (channel 2 of the low-VHF band) to a high of 397.25 MHz (for channel W+17 of the CATV hyperband). When the range of frequencies of RF carriers applied to a tuning system exceeds two to one, RF carriers at integral submultiples (i.e. $\frac{1}{2}$, $\frac{1}{3}$, $\frac{1}{4}$ etc.) of the selected RF carrier frequency may be selected by the peaked response of the impedance transformation network described in the Knight patent.

If the RF carriers at submultiples of the selected RF carriers are of sufficient amplitude at the RF amplifier, non-linearities in the RF amplifier will cause signals to be developed at harmonic frequencies, one of which will be at a frequency interfering with the selected RF carrier. This interference condition does not occur in a UHF-TV band only tuner and is not eliminated by the apparatus described by the Knight patent. It is particularly noticeable when CATV hyperband RF carriers are selected to be received because these carriers are usually lower in amplitude than are RF carriers at integral submultiples thereof due to greater cable losses at higher frequencies in most CATV systems.

In accordance with the present invention, apparatus in the receiver comprises a signal path including an amplifier between an input terminal at which carrier signals are received and an output terminal. A first signal selecting device interposed in the signal path responds to a tuning signal to select a carrier signal. A second signal selecting device interposed in the signal path has a resonant frequency below the frequency of the selected carrier signal and responds to the tuning signal in tracking relationship to the first signal selecting device.

Figure 2:
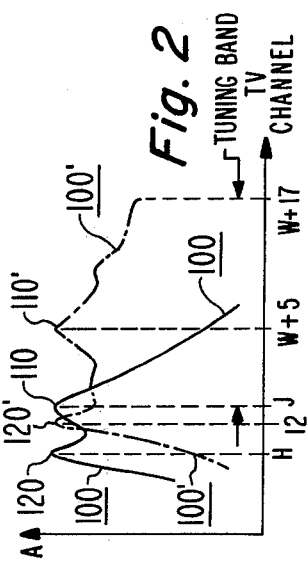

In the drawings:

FIG. 1 shows, partially in block diagram form and partially in schematic diagram form, a television tuning system employing the present invention; and FIG. 2 shows a graphical representation of amplitude vs. frequency characteristics associated with the tuning system shown in FIG. 1.

The television receiver of FIG. 1 receives from signal source 12 RF carrier signals corresponding to TV channels. Where signal source 12 is a CATV distribution system, those channels may include channels 2 through 6 in the low VHF band, channels A-5 through I in the CATV midband, channels 7 through 13 in the high VHF band, channels J through W in the CATV superband and channels W+1 through W+17 in the CATV hyperband.

When the channel selected corresponds to a carrier in the CATV superband or CATV hyperband, switch diode S1 is rendered conductive to apply the RF carriers to tuning circuit 10. When the channel selected is in the low or high VHF band or in the CATV midband, switch diode S2 is rendered conductive to apply the RF carrier to RF amplifier 20.

Tuning circuit 10 is rendered operative when the selected channel is in the CATV superband or hyperband by tuning control device 22 applying bandswitch voltage VB1 thereto. Positive voltage VB1 supplies operating voltage to an RF amplifier comprising dual-gate field-effect transistor (FET) T1. Voltage is applied to drain D of FET T1 via an inductance (shown in phantom) included in tuned circuit 16. Bias voltages are applied to the gate G1 of FET T1 by a voltage divider including resistors R3 and R4, and to its source S by a voltage divider including resistors R5 and R6. Bypass capacitor C5 exhibits very low impedances at the frequencies of the RF carriers received from source 12 so as to permit FET T1 to provide greater signal gain. VB1 is applied to the anode of switch diode S1 through inductor L2 to render it conductive. A return path for current flowing in switch diode S1 is provided by a series connection to ground of an inductance and a resistance (not shown) included in filter 14. VB1 is also applied as operating voltage to local oscillator LO.

Tuning control 22 develops a tuning voltage VT having magnitudes corresponding to respective ones of the RF carrier signals applied to tuning circuit 10. An impedance matching network including inductors L1 and L2 receives RF carriers from switch diode S1 and forms a signal selecting resonant network 15 having a peaked response in cooperation with the capacitance exhibited by variable capacitance (varactor) diode CD1. An RF carrier at a frequency corresponding to the series resonant frequency of the input tuning network 15 (including L1, L2 and CD1) is selected by the peaked response thereof at node N1 while RF carriers at higher and lower frequencies are attenuated at that node. The selected RF carrier is coupled to gate G1 of FET T1 by capacitor C3 which is selected to overcome the effects of the capacitance present at the gate G1 of FET T1. Bypass capacitors C1 and C4 exhibit low impedance at the RF carrier frequencies and do not affect the resonant frequency of this input tuning network.

Tuning voltage VT is applied to CD1 through resistor R1 to vary the capacitance of CD1. When the magnitude of VT is large, the capacitance of CD1 is small and the input tuning resonant network 15 selects RF carriers near the high frequency end of the CATV hyperband. When the magnitude of VT is low, the capacitance by CD1 is high and the input tuning resonant network 15 selects RF carriers near the low frequency end of the CATV superband.

To obtain satisfactory performance over a wide range of frequencies, a second signal selecting resonant network can be employed to increase the relative amplitudes of RF carriers near the low end of the CATV superband band relative to that of RF carriers at the high frequency end of that band as is described in U.S. Pat. No. 4,048,598, referred to above. Where the range of frequencies of the RF carriers exceeds two to one, undesirable interfering signals at the selected RF carrier frequency can be developed owing to the development of harmonics of the signals selected by the peaked response of such second network. FET amplifier T1 can develop these unwanted interfering signals. This interference is most evident when the frequency of the selected RF carrier is twice the frequency of the resonant peak of the second network and the non-linear response of FET T1 generates signals at the second harmonic of an RF carrier at the frequency of the second network. For example, if CATV hyperband channel W+3 (313.25 MHz) is selected and the second network has a peaked response at 157 MHz, then the second harmonic of CATV midband channel G (157.25 MHz) can interfere.

RF carriers are coupled from drain D of FET T1 to mixer MX by double-tuned band-pass filter circuit 16. A local oscillator signal at a frequency responsive to tuning voltage VT is applied to mixer MX whereby the RF carriers are heretodyned to produce a signal IF at a predetermined intermediate frequency (e.g. 45.75 MHz in the United States) which is the difference between the frequencies of the RF carrier and the local oscillator signal. Where mixer MX receives a selected RF carrier desired to be selected at a first frequency and a harmonic of another RF carrier at the same frequency, both signals will be at the IF frequency and will be applied to TV signal processing apparatus 30 which develops and applies picture information signals to kinescope KS and sound information signals to loudspeaker LS. Because both signals are applied to apparatus 30, it will respond to the combination of the picture and sound information received on the desired RF carrier and that in the undesired RF carrier. As a result of that interference, the quality of the reproduced picture and sound information will be objectionably degraded.

To avoid this undesireable interference, second resonant network 18 includes an inductance L6 which series resonates with the capacitance of variable capacitance diode CD2 and the capacitance exhibited at node N2 at a frequency below that at which the input tuning network 15 resonates. Network 18 is tunable by capacitance diode CD2 in response to tuning voltage VT applied through resistor R2 so that the resonant frequency of network 18 changes in like direction to that of the input tuning network 15. The capacitance at node N2 is contributed to by C3, CD1 and the gate-source capacitance of FET T1. Bypass capacitor C2 exhibits low impedance at the RF carrier frequencies and has insignificant effect upon the resonance of network 18.

The graphs of FIG. 2 show the relative amplitude vs. TV channel (increasing TV channel correponding to increasing frequency) responses of tuning circuit 10 as measured at the drain D of FET T1. Curve 100 represents the response when an RF carrier near the low frequency end of CATV superband is selected, e.g. channel J. Resonant peak 110 is produced by the input tuning network 15 at the frequency of desired RF carrier, i.e. that of channel J. Resonant peak 120 is produced by resonant network 18 at a frequency below the operable frequency range of tuning circuit 10, e.g. that of CATV midband channel H. As the frequency of the selected RF carrier corresponding to the desired channel and the resonant peak of input tuning network 15 increase (e.g. from channel J to channel W+5), the frequency of the resonant peak of resonant network 18 also increases (e.g. from channel H to channel 12) so that the frequency of the low frequency resonant peak (e.g., 120, 120') is in tracking relationship with and is not an integral submultiple of that of the higher frequency resonant peak (e.g. 110, 110"). Curve 100' in FIG. 2 represents the response when CATV hyperband channel W+5 is selected. Resonant peak 110' is produced by the input tuning network 15 while resonant peak 120' is produced by resonant network 18.

The change in the resonant frequency of network 18 is typically smaller than that of input tuning network 15. Substantially, the full change of capacitance of CD1 is employed to change the frequency of the input tuning network whereas only a portion of the change in the capacitance of CD2 is effective to change the frequency of network 18. This is so because the change in capacitance of diode CD1 causes a correspnding change in the capacitance at node N2 which reduces the effect of the capacitance change of diode CD2. This effect is reduced where CD2 provides a greater capacitance change than does CD1 in response to the particular change of tuning potential VT. For example, CD1 can be a BB-105 varactor exhibiting a 2–12 picofarad capacitance while CD2 can be a BB-329 varactor exhibiting a 3–36 picofarad capacitance, which varactors are commercially available from Siemens A. G. or Hitachi America Ltd. C3 can be 6.8 picofarads and L6 can be about 160 nanohenries. Bypass capacitors C1, C2 and C4 are each 1000 picofarads. Resistors R1 and R2 are each 10 kilohms. A gate G1 capacitance of about 1–2 picofarads is exhibited by FET T1 which can be a 3SK80 available from Hitachi America, Ltd.

When a selected RF carrier corresponds to a channel in the low or high VHF band or in the CATV midband, tuning control 22 develops bandswitch voltage VB2 which serves as operating voltage for RF amplifier 20 and which renders diode switch S2 conductive in analogous manner to that described above with respect to diode switch S1. RF amplifier 20 passes the selected RF carrier to TV signal processing apparatus 3 which also receives tuning voltage VT.

Signal processing apparatus 30 develops an automatic gain control signal VAGC in response to the amplitude of the IF signal. The IF signal is either supplied from tuning circuit 10 when CATV superband and hyperband RF carriers are selected or is developed by apparatus 30 from the RF signals supplied from RF amplifier 20 when VHF or CATV midband RF carriers are to be selected. Automatic gain control signal VAGC is applied to gate G2 of FET T1 in tuning circuit 10 and to RF amplifier 20 to vary their respective gains.

Apparatus suitably employed as filter 14, tuned curcuit 16, mixer MX, local oscillator LO, RF amplifier 20, tuning control 22, and signal processing apparatus 30 is conventional and is described, for example, in RCA Television Product Technical Manual, May, 1981 RCA Television Service Data Supplement, Chassis CTC 110 series, File 1981 C-1-S5, both of which are published by RCA Corporation, Consumer Electronics, Indianapolis, Ind.

Modifications to the above described embodiment are contemplated to be within the scope of the present invention which is limited only by the claims following. For example, resonant network 18 could be interposed in the signal path between switch diode S1 and mixer MX at a point in the drain D circuit of FET T1 rather than in the gate G1 circuit of FET T1 as shown. In that modification, network 18 would cooperate with tuned circuit 16 for avoiding the passing of plural RF carriers which are integral multiples of each other. In addition, it would also be satisfactory to employ an RF amplifier employing a bipolar transistor instead of a field-effect transistor, or for parallel resonant signal selection networks to be used in place of the particular series resonant configurations of the input tuning network and of network 18 shown in FIG. 1.

What is claimed is:

1. In a receiver, apparatus comprising:
   a signal source of radio frequency carrier signals in a frequency band;
   a signal path between an input terminal for receiving said carrier signals and an output terminal including amplifying means for amplifying said carrier signals;
   a control source for supplying a tuning signal having different magnitudes corresponding to respective radio frequency carrier signals;
   first signal selecting means coupled to said signal path at a point between said input terminal and said amplifying means and having a peaked response which is tunable in response to said tuning signal for selecting ones of said carrier signals included within a portion of said frequency band;
   second signal selecting means coupled to said signal path at a point between said input terminal and said amplifying means for exhibiting a peaked response at a resonant frequency no greater than the lowest frequency of any of said selected ones of said carrier signals, said second signal selecting means including
   means tunable in response to said tuning signal for varying the resonant frequency of said second signal selecting means in tracking relationship to the peaked response of said first signal selecting means.

2. The apparatus of claim 1 wherein said tracking relationship is selected for making the peaked response of said second signal selecting means at other than an integral sub-multiple of that of said first signal selecting means.

3. The apparatus of claim 1 wherein said second signal selecting means includes:
   first variable capacitance means for exhibiting a capacitance responsive to said tuning signal, and
   a first inductance coupled in series with said first variable capacitance means.

4. The apparatus of claim 3 wherein said first variable capacitance means and said first inductance are coupled between an input connection of said amplifying means and a point of reference potential.

5. The apparatus of claim 3 wherein said first signal selecting means includes:
   second variable capacitance means for exhibiting a capacitance responsive to said tuning signal, and
   a second inductance coupled in series with said second variable capacitance means.

6. The apparatus of claim 5 wherein said signal source is coupled to one end of said series connection of said second variable capacitance means and said second inductance and the other end thereof is coupled to a point of reference potential, said first signal selecting means further including reactance means for coupling interconnection of said second voltage variable capacitance means and said second inductance to an input connection of said amplifying means.

7. The apparatus of claim 1, 2, 3, 4, 5 or 6 wherein said amplifying means includes a field-effect transistor having a gate electrode to which the input terminal of said signal path is coupled and having a drain electrode coupled to the output terminal of said signal path.

8. Tunable radio frequency amplifier apparatus comprising:
   a source of radio frequency carrier signals;
   amplifying means having input and output terminals;
   a circuit node;
   means including a first inductance for coupling said source of carrier signals to said circuit node;
   means including a capacitance for coupling said said circuit node to said input terminal;
   first variable capacitance means responsive to a tuning signal and coupled to said circuit node for cooperating with said first inductance to select one of said carrier signals;
   a series connection of a second inductance and a second variable capacitance means responsive to said tuning signal and coupled to said input terminal; and
   means for applying said tuning signal to said first and second variable capacitance means.

9. The apparatus of claim 8 wherein said first and second variable capacitance means exhibit respective capacitances which change by differing amounts in response to the same change in said tuning signal.

10. The apparatus as set forth in claim 1 or in claim 8 in combination with:
    local oscillator means for generating a local oscillator signal having a frequency determined by the magnitude of said tuning signal; and
    mixing means for combining a selected one of said carrier signals supplied from said output terminal and said local oscillator signal to produce an intermediate frequency signal.

11. The apparatus of claim 10 wherein said amplifying means includes a gain control terminal and further including means for applying a signal developed in response to a predetermined amplitude condition of said intermediate frequency signal to said gain control terminal.

* * * * *